United States Patent
Grider et al.

(10) Patent No.: US 6,645,840 B2
(45) Date of Patent: Nov. 11, 2003

(54) MULTI-LAYERED POLYSILICON PROCESS

(75) Inventors: Douglas T. Grider, McKinney, TX (US); Che Jen Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/967,061

(22) Filed: Sep. 28, 2001

(65) Prior Publication Data

US 2002/0048918 A1 Apr. 25, 2002

Related U.S. Application Data

(60) Provisional application No. 60/241,571, filed on Oct. 19, 2000.

(51) Int. Cl.[7] ................ H01L 21/3205; H01L 21/4763
(52) U.S. Cl. .................. 438/592; 438/591; 438/595
(58) Field of Search ................ 438/592, 591, 438/595, 410, 439, 440, 528, 669, 738

(56) References Cited

U.S. PATENT DOCUMENTS

| | | | | |
|---|---|---|---|---|
| 4,847,213 A | * | 7/1989 | Pfiester | 438/228 |
| 5,053,849 A | * | 10/1991 | Izawa et al. | 438/595 |
| 5,264,396 A | | 11/1993 | Thakur et al. | |
| 5,580,816 A | * | 12/1996 | Hemmenway et al. | 438/275 |
| 5,891,798 A | * | 4/1999 | Doyle et al. | 438/624 |
| 5,963,817 A | * | 10/1999 | Chu et al. | 438/410 |
| 6,010,947 A | * | 1/2000 | Kondo | 438/692 |
| 6,037,630 A | * | 3/2000 | Igarashi et al. | 438/231 |
| 6,114,230 A | | 9/2000 | Chang et al. | |
| 6,251,751 B1 | * | 6/2001 | Chu et al. | 438/410 |
| 6,255,173 B1 | * | 7/2001 | Jang | 438/279 |
| 6,259,131 B1 | * | 7/2001 | Sung et al. | 257/315 |
| 6,335,262 B1 | * | 1/2002 | Crowder et al. | 438/440 |
| 6,399,469 B1 | * | 6/2002 | Yu | 438/591 |

* cited by examiner

Primary Examiner—John F. Niebling
Assistant Examiner—Walter L. Lindsay, Jr.
(74) Attorney, Agent, or Firm—Peter K. McLarty; W. James Brady, III; Frederick J. Telecky, Jr.

(57) ABSTRACT

A method for forming a notched MOS gate structure is described. A multi-layer gate structure is formed (150) where the top layer (140) oxidizes at a faster rate compared to the bottom layer (130). This results in the formation of a notch (165) in the gate structure after thermal oxidation processes.

11 Claims, 2 Drawing Sheets

MULTI-LAYERED POLYSILICON PROCESS

This application claims priority under 35 USC §119(e)(1) of provisional application Serial No. 60/241,571, filed Oct. 19, 2000.

FIELD OF THE INVENTION

The invention is generally related to the field of semiconductor devices and more specifically to multi-layered polysilicon process for reducing gate capacitance.

BACKGROUND OF THE INVENTION

There are a number of extrinsic capacitances associated with a MOS transistor. A typical MOS transistor is shown in FIG. 1. An gate dielectric 20 is formed on a semiconductor substrate and a transistor gate 30 is formed on the gate dielectric 20. Following the formation of the transistor gate 30, ion implantation is used to form the drain and source extension regions 40 in the substrate. Sidewall structures 50 are then formed adjacent to the gate 30 and the source and drain regions 60 are then formed by ion implantation. During the subsequent high temperature anneal, necessary to activate the implanted dopants, lateral diffusion of the implanted species will result in the formation of the overlap regions 70 shown in FIG. 1. These overlap regions 70 gives rise to "overlap capacitances". The value of these overlap capacitances depends on the thickness of the gate dielectric 20 in the region of overlap 70 as well as the area of the overlap region. As the area of the transistor gate 30 is reduced, this overlap capacitance becomes a larger percentage of the total overall transistor capacitance resulting in a reduction in transistor and integrated circuit performance. A number of different techniques are current being used to reduce this overlap capacitance. These include the use of silicon oxide spacers between the transistor gate 30 and the sidewall structures 50 and the formation of a notch at the bottom of the transistor gate adjacent to the gate dielectric 20. The current methods used to form the notch involve timed etches which are unreliable, not easily controlled, and not very reproducible. The size of the transistor gate is the most critical parameter in determining transistor performance and reliability and as such any processing technique which varies the size of the transistor gate must be precisely controllable, reproducible, and reliable. There is therefore a great need for a method of forming a notch on a transistor gate that is precisely controllable, reproducible, and reliable.

SUMMARY OF THE INVENTION

The instant invention describes a method for forming a notched gate for MOS transistors. The method comprises forming a multi-layered gate structure comprised of layers with differing oxidation rates. The oxidation rates of the various layers are varied by the incorporation of an oxidation rate retardant such as carbon and nitrogen or a species that will enhance the oxidation rate such as chlorine or fluorine. Thermal oxidation processes after gate etch will result in the formation of a notched gate structure. The notched gate method of the instant invention is precisely controllable resulting in increased uniformity compared to existing methods.

DETAILED DESCRIPTION OF THE INVENTION

The invention will now be described with reference to FIGS. 2A–2D and FIGS. 3A–3C. It will be apparent to those of ordinary skill in the art that the benefits of the invention can be applied to other structures where high value capacitor is required.

Figure 1:
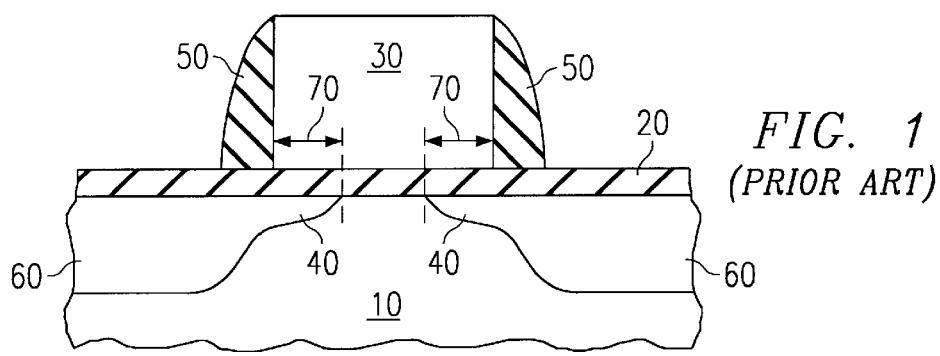
FIG. 1 is a cross-sectional diagram of a typical MOS transistor
Figure 2A:
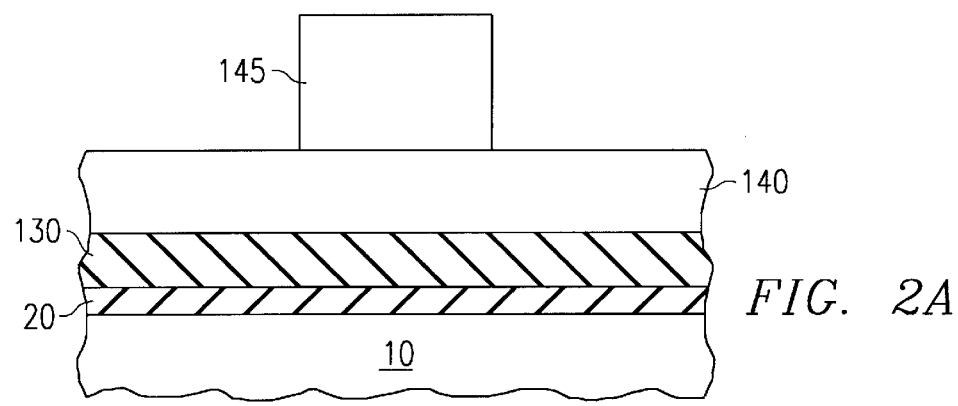
FIGS. 2A–2D are cross-sectional diagrams illustrating one embodiment of the instant invention.

A silicon substrate 10 which may be single-crystal silicon or an epitaxial silicon layer formed on a single crystal substrate is provides as shown in FIG. 2A. The substrate may contain isolation structures and other semiconductor device structures which are not shown for clarity. Referring to FIG. 2A, a gate dielectric 20 is formed on substrate 10. Gate dielectric 20 may be comprised of an oxide, thermally grown $SiO_2$, a nitride, an oxynitride, a silicate or any combination thereof, and is preferably on the order of 1 to 10 nm thick. In addition to the above mentioned materials the gate dielectric 20 can be formed using any dielectric material with suitable properties.

Following the gate dielectric formation a first or lower silicon containing layer 130 is formed over the gate dielectric 20. Following the formation of the first or lower silicon containing layer 130, A second or upper layer of silicon containing material 140 is formed over the first silicon containing layer 130. In an embodiment of the instant invention, both first and second silicon containing layers 130, 140 are comprised of amorphous silicon. Other embodiments will include any combination of single crystal silicon, polycrystalline silicon, or amorphous silicon among the layers 130 and 140. In an embodiment of the instant invention, nitrogen or carbon is incorporated into the second silicon containing layer 140. In the case of amorphous or polycrystalline films formed using chemical vapor deposition (CVD), a nitrogen source gas such as $N_2O$ or $NH_3$ can be introduced during actual film deposition to incorporate nitrogen into the film 140 during growth. Nitrogen can also be incorporated into the second layer 140 by implanting a nitrogen containing species into the film 140 after formation. Carbon can be incorporated into the second layer 140 by introducing a carbon containing species during a CVD layer formation process or by implanting the second layer 140 with a carbon containing species after the layer 140 is formed. Introducing nitrogen or carbon into the second layer 140 will retard the oxidation rate of the second layer 140 compared to the first layer 130 during subsequent process steps. The instant invention is not intended to be limited to the use of nitrogen and carbon. Any species which retards the oxidation rate of the second layer 140 to a predetermined value can be used. The description of the use of nitrogen and carbon are intended to be illustrative embodiments of the instant invention.

In another embodiment of the instant invention, the oxidation rate of the first layer 130 can be enhanced compared to that of the second layer 140 by incorporating chlorine, fluorine or bromine into the first layer 130. This can be accomplished by introducing species containing chlorine, fluorine, or bromine during a CVD process to form the layer 130 or by implanting these species into the layer 130 after it is formed. Any species which enhances the oxidation rate of the first layer 130 to a predetermined value can be used. The description of the use of chlorine, fluorine, and bromine are intended to be illustrative embodiments of the instant invention. Following the formation of layers 130 and 140, a photoresist film is formed and patterned 145 as shown in FIG. 2A.

Figure 2B:
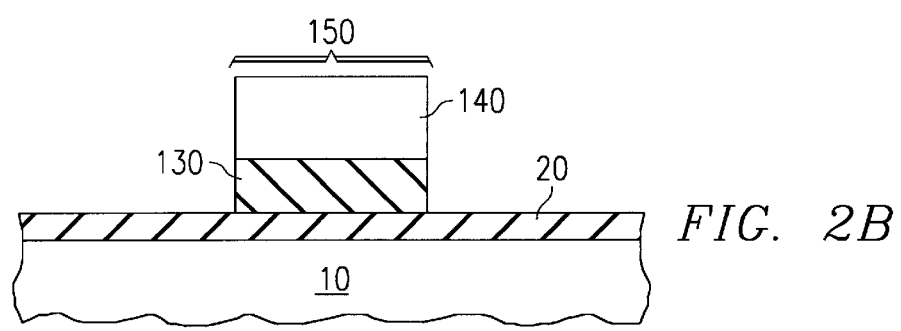
Figure 2C:
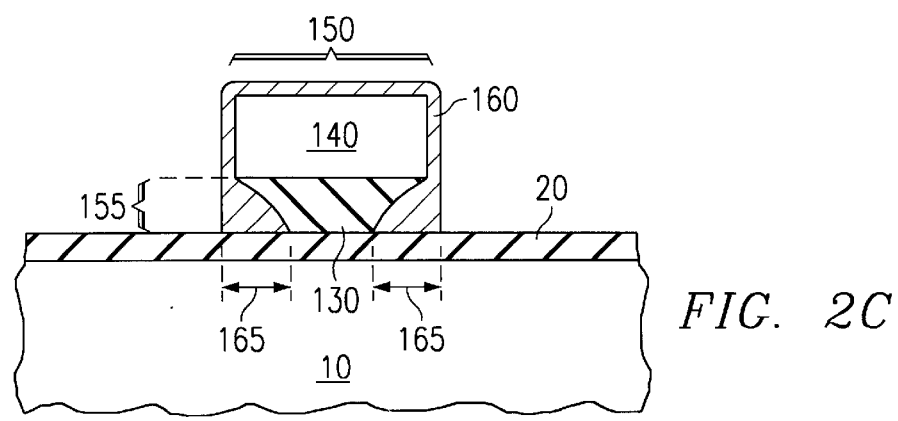

Illustrated in FIG. 2B is the structure of FIG. 2A following an anisotropic transistor gate etch process to define the transistor gate region 150. As shown in FIG. 2B, the transistor gate 150 comprises a multi-layer structure comprising layers 130 and 140. Following the formation of the transistor gate 150, a thermal oxidation process is performed. This oxidation process results in the formation of a silicon oxide layer 160 around the transistor gate 150 and a notch 155 in the first silicon containing layer 130. The formation of the notch 155 in layer 130 is due to the different oxidation rates of the layers 130 and 140. This difference in oxidation rates is due to nitrogen or carbon incorporation in the second layer 140 or fluorine, chlorine, or bromine incorporation into the first layer 130. The offset distance 165 between the edge of the gate and the edge of the drain and source extension implants will be controlled by the different oxidation rates of the first and second layers 130 and 140 and the oxidation process conditions. Because the oxidation rates of the layers is well known or can be easily measured and the oxidation process itself is precisely controllable, the notch 155 produced in the manner described in the instant invention is precisely controllable, reproducible, and reliable.

Figure 2D:
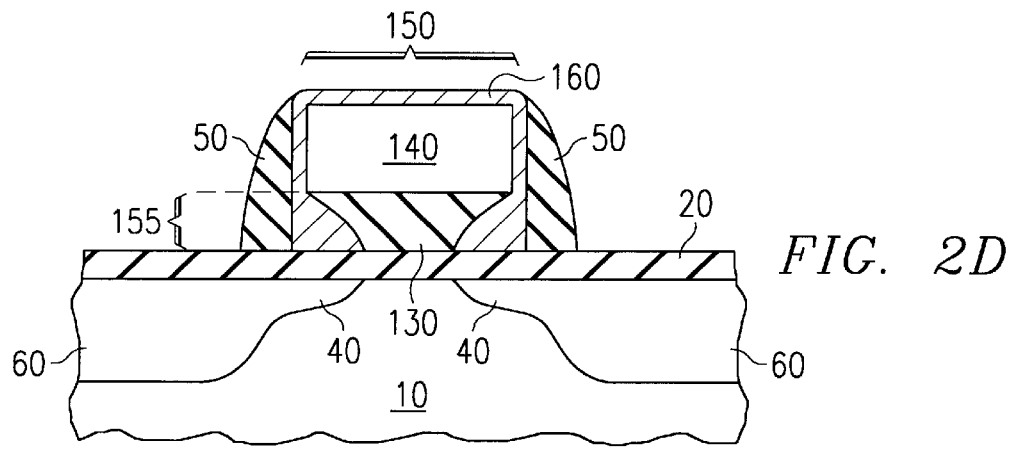

Following the formation of the notch 155 in the transistor gate 150, the MOS transistor can be completed using standard semiconductor processing. A completed transistor is shown in FIG. 2D. The overlap of the transistor gate 150 and the drain and source extensions 40 have be reduced by the notch 155 in the first layer 130. In addition to the reduction in overlap capacitance, the notched transistor gate has the added advantage of reducing the transistor gate length (and capacitance) while maintaining ease of silicidation with a longer gate length at the top of the transistor gate 150.

Figure 3A:
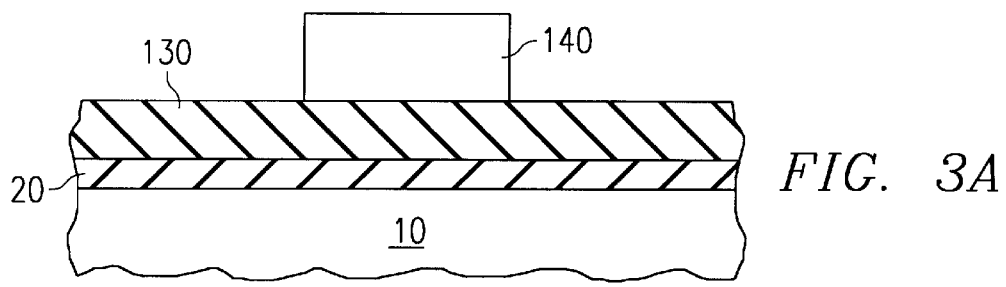
FIGS. 3A–3C are cross-sectional diagram illustrating another embodiment of the instant invention.
Figure 3B:
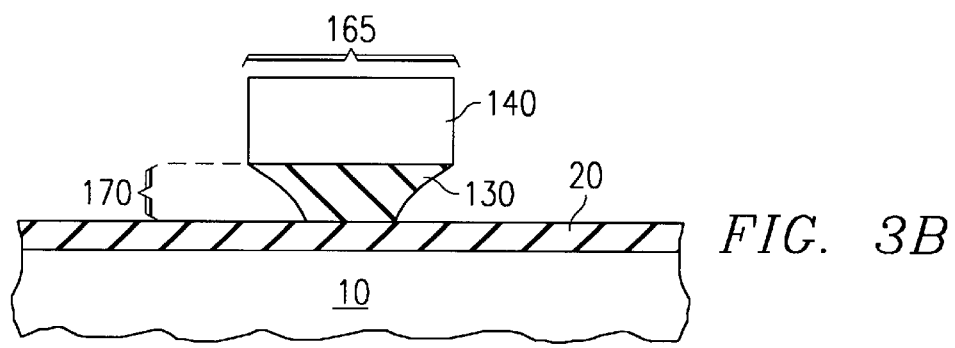
Figure 3C:
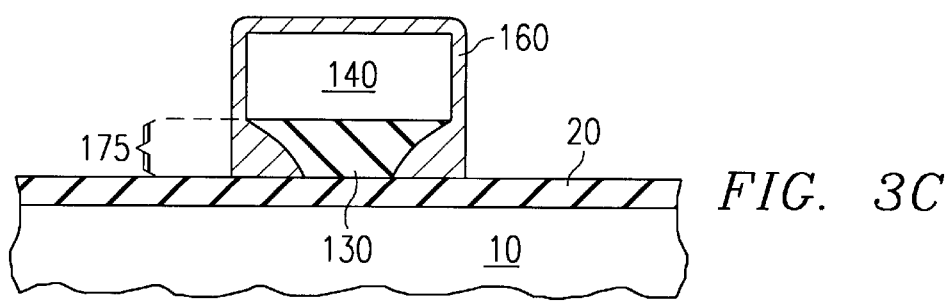

In another embodiment of the instant invention, a dual etch process is used to form the transistor gate. As shown in FIG. 3A, in the first step of this dual etch process, an anisotropic etch is used to etch the second layer 140 resulting in practically parallel vertical sides. In the embodiment where nitrogen or carbon is incorporated into the second layer, the endpoint of the anisotropic etch is determined by detecting the point where the nitrogen or carbon content in the etched species fall below some predetermined value. In the embodiment where chlorine, fluorine, or bromine is incorporated into the first layer 130, the endpoint of the anisotropic etch is determined by detecting a rise in the concentration of chlorine, fluorine, or bromine in the etched species. In the second step of the dual etch process, a more isotropic etch is used etch the first layer 130. This isotropic etch results in a notched transistor gate 165 by forming an initial notch 170 in the first layer 130. This dual etch process is followed by thermal oxidation which oxidizes the layers at different rates resulting in an oxide layer 160 and enhancement of the notch 175 in the first layer. Following the formation of the enhanced notch 175 in the transistor gate 165, the MOS transistor can be completed using standard semiconductor processing.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating a transistor gate comprising:

providing a semiconductor substrate with a gate dielectric;

forming a first layer over said gate dielectric with a first oxidation rate;

forming a second layer over said first layer with a second oxidation rate such that said second oxidation rate is less that said first oxidation rate;

forming a transistor gate structure by etching said first and second layers; and oxidizing said first and second layers to form a notch mainly in said first layer.

2. The method of claim 1 wherein said first layer is a silicon containing layer.

3. The method of claim 1 wherein said second layer is a silicon containing layer.

4. The method of claim 2 wherein said first layer further contains species selected from the group consisting of fluorine, chlorine, and bromine.

5. The method of claim 3 wherein said second layer further contains species selected from the group consisting of carbon and nitrogen.

6. A method of fabricating a transistor gate comprising:

providing a semiconductor substrate with a gate dielectric;

forming a first silicon containing layer over said gate dielectric with a first oxidation rate;

forming a second silicon containing layer over said first layer with a second oxidation rate such that said second oxidation rate is less that said first oxidation rate;

forming a transistor gate structure by etching said first and second layers; and oxidizing said first and second silicon containing layers to form a notch mainly in said first layer.

7. The method of claim 6 wherein said first silicon containing layer is amorphous silicon.

8. The method of claim 6 wherein said second silicon containing layer is amorphous silicon.

9. The method of claim 7 wherein said first silicon containing layer further contains species selected from the group consisting of fluorine, chlorine, and bromine.

10. The method of claim 8 wherein said second silicon containing layer further contains species selected from the group consisting of carbon and nitrogen.

11. The method of claim 6 wherein said oxidizing said first and second silicon containing layers comprises a thermal oxidation process.

* * * * *